United States Patent
Ooi

(10) Patent No.: US 6,740,918 B2
(45) Date of Patent: May 25, 2004

(54) SEMICONDUCTOR MEMORY DEVICE

(75) Inventor: Makoto Ooi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/208,821

(22) Filed: Aug. 1, 2002

(65) Prior Publication Data

US 2003/0030087 A1 Feb. 13, 2003

(30) Foreign Application Priority Data

Aug. 10, 2001 (JP) ........................................ 2001-244390
Jun. 28, 2002 (JP) ........................................ 2002-190984

(51) Int. Cl.$^7$ ........................................... H01L 27/108
(52) U.S. Cl. .................... 257/296; 257/298; 257/300; 257/314; 257/315; 257/905; 257/906; 257/908
(58) Field of Search ..................... 257/68–71, 296–313, 257/905–908

(56) References Cited

U.S. PATENT DOCUMENTS

| | | | | |
|---|---|---|---|---|
| 5,700,722 A | * | 12/1997 | Sumi ........................... | 438/649 |
| 5,717,254 A | * | 2/1998 | Hashimoto ................... | 257/773 |
| 6,103,574 A | * | 8/2000 | Iwasaki ........................ | 438/257 |
| 6,160,294 A | * | 12/2000 | Hashimoto ................... | 257/369 |
| 6,191,446 B1 | * | 2/2001 | Gardner et al. .............. | 257/330 |
| 6,268,248 B1 | * | 7/2001 | Mehrad ........................ | 438/262 |
| 6,277,693 B1 | * | 8/2001 | Chen ............................ | 438/264 |
| 6,319,772 B1 | * | 11/2001 | Tee et al. ..................... | 438/256 |
| 6,346,477 B1 | * | 2/2002 | Kaloyeros et al. ........... | 438/680 |
| 6,384,437 B1 | * | 5/2002 | Tee et al. ..................... | 257/239 |
| 6,413,843 B1 | * | 7/2002 | Hara ............................ | 438/525 |

FOREIGN PATENT DOCUMENTS

| | | |
|---|---|---|
| JP | 2000-36546 | 2/2000 |
| JP | 2000-216270 | 8/2000 |

* cited by examiner

*Primary Examiner*—David Nelms
*Assistant Examiner*—Andy Huynh
(74) *Attorney, Agent, or Firm*—Burns, Doane, Swecker & Mathis, L.L.P.

(57) ABSTRACT

The invention provides a semiconductor memory device having a trench part serving as an isolation area formed on semiconductor substrate, control gate used for controlling write-operation and read-operation formed orthogonally to the trench part, a source line of a first diffused layer formed on the surface of the trench part along one of the longitudinal sides of the control gate, and on the semiconductor substrate between the neighboring trench parts, silicide layer formed over the surface of the source line, and a drain of a second diffused layer formed between the trench parts in the other of the longitudinal sides.

5 Claims, 12 Drawing Sheets

SEMICONDUCTOR MEMORY DEVICE

BACKGROUND OF THE INVENTION

1. Field of the Invention

The present invention relates to the memory cell array of a non-volatile semiconductor memory device. More particularly, the invention relates to a semiconductor memory device in which the resistance of its source line can be reduced, and the method of manufacturing the same device.

2. Description of the Prior Art

Conventionally, a flash memory device has been known as a semiconductor memory device, particularly as a non-volatile semiconductor memory device having the feature of holding data memorized therein even if the power supply is cut off. Recently, there have arisen both a demand for the increase of a memory capacity by high integration to the flash memory device as well as to other semiconductor devices, and a demand for cost reduction by the reduction of a chip area conflicting with the above trend. In order to respond the demands, the reduction of the area of the memory cell per bit has become absolutely necessary.

Among the memory cells of the flash memory are several types of memory cells, NOR type, AND type, and NAND type memory cells. In the most typical NOR type memory cell, it is known that a stack gate structure is suitable for reducing the area of the memory cell. Hereinafter, the structure of the NOR type memory cell array having the stack gate structure will be shortly described.

FIG. 21 is a block diagram showing the peripheral parts of the memory cell array of the flash memory in a conventional semiconductor memory device. In FIG. 21 are disposed control logic circuit 101, address buffer 102, input-output buffer 103, X address decoder 104, Y address decoder 105, write circuit 106, sense amplifier 107, Y gate 108, and memory cell array 109.

X address decoder 104 selecting a X address to the memory cells of memory cell array 109 flatly arranged in a matrix state is disposed at the position adjacent to memory cell array 109, and Y address decoder 105 selecting a Y address thereto is connected with memory cell array 109 through Y gate 108. When write operation and read operation to the memory cell are done, the addresses of X and Y are selected by control logic circuit 101.

FIG. 22 is a schematic diagram showing the memory cell array of the flash memory in the conventional semiconductor memory. In FIG. 22, because the same reference numerals indicate the same or equivalent parts in FIG. 21, the explanation is omitted. In the figure are disposed source line 110, word lines $WL_{n-1}, \ldots, WL_{n+2}$ of X address decoder 104, bit lines $BL_{n-2}, \ldots, BL_{n+2}$ of Y gate 108, and source lines $SL_{n-1}, \ldots, SL_{n+1}$.

The source lines and the word lines are arranged in the direction of X, and the bit lines are arranged in the direction of Y such that the bit lines cross the source lines and the word lines. The cells disposed in the direction of the word line use a common word line, which is generally formed of such wiring material as polysilicon and the like in the stack gate structure. The common word line is referred to as a control gate because the word line controls the write operation and the read operation of the memory cell. The control gate is elongated in the direction of X on a floating gate serving as the charge storage electrode of each memory cell. The memory cells arranged in the direction of the bit line also use a common bit line, which uses aluminum as the wiring material and is connected with the drain of the memory cell through a contact. The source lines arranged parallel to the word lines are connected with each other at the end of memory cell array 109, and all of the source lines existing in memory cell array 109 use a common source line.

The operation will next be described.

When a specific bit in memory cell array 109 is selected; a voltage is applied between bit line $BL_n$ and word line $WL_n$ for instance; and a bit in which bit line $BL_n$ and word line $WL_n$ cross each other is selected, because a current flows from bit line $BL_n$ into the bit when the threshold voltage Vth of the selected bit is low ('0' state), a channel current flows from the drain of the selected bit into the source, and finally reaches source line 110 serving as GND. On the other hand, when threshold voltage Vth of the selected bit is high ('1' state), because the channel of the bit does not turn on even if a voltage is applied between bit line $BL_n$ and word line $WL_n$, a current does not flow.

Sense amplifier 107 discriminates whether a current flows into the selected bit when a voltage is applied to the bit line. That is, sense amplifier 107 discriminates whether the current flowing into the selected bit is more or less than a certain specific current value. Thereby, information memorized in the selected bit can be read by '0' or '1'. However, because the flowing current reduces when the resistance of the source line is high, the possibility that sense amplifier 107 misreads the information memorized in the selected bit increases.

FIG. 23 is a plan view showing the memory cell array of the flash memory in the conventional semiconductor memory device. In FIG. 23 are disposed word line 111, source line 112, floating gate 113, control gate 114, drain 115, and memory cell 116 per bit.

FIGS. 24–27 are sectional views of specific parts in the plan view of the memory cell array shown in FIG. 23. FIG. 24 is a sectional view taken along the line A–A' in the part of the control gate. FIG. 25 is a sectional view taken along the line B–B' in the part of the source line. FIG. 26 is a sectional view taken along the line C–C' in the part of the memory cell. FIG. 27 is a sectional view taken along the line D–D' in the part of a STI isolation oxide film. In FIGS. 24–27, because the same reference numerals indicate the same or equivalent parts in FIG. 23, the explanation is omitted. From FIG. 25, it can be easily understood that source line 112 has a structure in which the source resistance increases easily in vertical part 121.

STI (Shallow Trench Isolation) isolation oxide film method is a method of forming an isolation oxide film by means of the steps of: selectively etching the part in a semiconductor substrate becoming an isolation oxide film, burying an isolation oxide film in the etched part, and planarizing the surface by means of CMP (Chemical, Mechanical, and Polishing) method and the like. The method is a manufacturing method having been used for the high integration in recent years. Conventionally, a selective oxidation method such as well-known LOCOS method has been used as a method of forming the isolation oxide film.

By the way, there is SAS (Self Aligned Source) structure technology serving as a technology of reducing the area of the memory cell of the flash memory. The SAS structure technology is a technology contrived for the measures against the following drawback. That is, when the isolation oxide film is formed in the source line of the above-described memory cell, a bird's beak area has become a hindrance to the reduction of the memory cell area though the isolation oxide film has been previously arranged such that the oxide film is not formed in the area serving as the source line. The SAS structure technology is the technology of forming the source line in the following manner. When an isolation oxide film is formed, a stripe-shaped isolation oxide film is formed in the direction of the bit line. After forming the control gate and the floating gate of the memory cell, a part of isolation oxide film formed in the area becoming a source line in a self alignment manner by using the control gate as a part of the mask is removed by means of etching process, and simultaneously the source line is formed by means of ion implantation process.

The conventional semiconductor memory device is arranged as mentioned above. For this reason, in the case the isolation oxide film formed by means of the STI technology is etched by means of the SAS technology when the STI technology is used in combination with the SAS technology, because injection ion species required for sufficiently reducing the source line resistance are not injected, in the ion implantation that is the post process, into a vertical part from which the STI oxide film is removed because of the convexo-concave surface shape of the semiconductor substrate, the source line resistance increases, and thereby the operation in which the channel current of the memory cell appears to be lowered is caused when a cell far from the part in which the source line is drawn is read. As a result, there is a drawback that the sense amplifier apparently determines the threshold voltage of the memory cell to be higher than its actual threshold voltage.

Additionally, in the conventional semiconductor memory device, because the sense amplifier seemingly judges that the threshold voltage of the memory cell is higher than the actual threshold voltage, there is a drawback that discrepancies occur in the write/delete operation because of the increase of the width of distribution of the threshold voltage.

Moreover, in the conventional semiconductor memory device, there is a drawback that the memory cell array malfunctions when the resistance of the source line increases to be shorted.

SUMMARY OF THE INVENTION

The present invention has been accomplished to solve the above-mentioned drawbacks, and an object of the present invention is to provide a semiconductor memory device in which a memory cell can be further down-sized by having a structure reducing source line resistance and a method of manufacturing the memory device.

According to a first aspect of the present invention, there is provided a semiconductor memory device including: a plurality of trench parts in a stripe shape formed on a semiconductor; a gate electrode formed to be orthogonal to these trench parts and having longitudinal sides along the orthogonal direction; a first diffused layer formed on the surface of the trench parts and on the semiconductor substrate between the trench parts adjacent to each other along one of the longitudinal sides; a salicide layer formed on the surface of the first diffused layer; and a plurality of second diffused layer formed between the trenches on the other of the longitudinal sides.

Thus, it is possible to achieve easily the reduction of the resistance of the first diffused layer, and also to narrow the width of the diffused layer due to the reduced resistance of the first diffused layer, thereby reducing the area of the memory cell.

Here, the first diffused layer is formed consecutively on the sides and the bottom surfaces of the trench parts, and on the surfaces of the semiconductor substrate between the trench parts, and is formed to the inside of the semiconductor substrate from the salicide layer.

Thus, a junction leakage between the salicide layer and the semiconductor substrate may be suppressed.

DETAILED DESCRIPTION OF THE PREFERRED EMBODIMENTS:

An embodiment of the present invention will be described below.

EMBODIMENT 1

Figure 1:
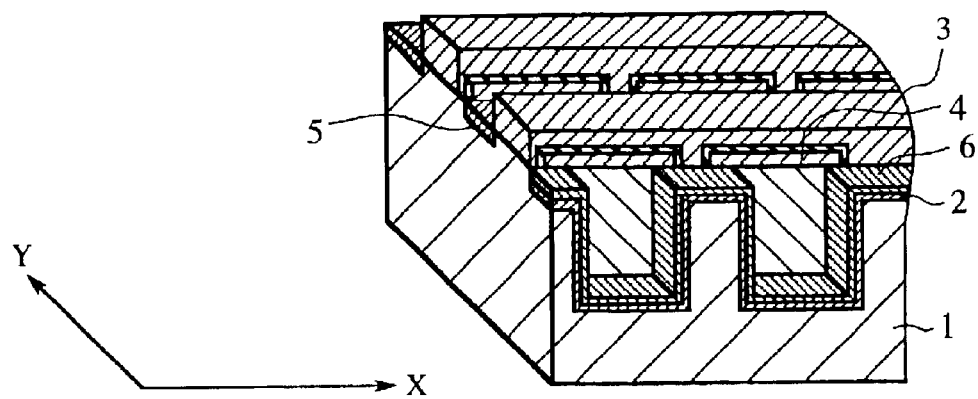
FIG. 1 is a perspective view showing the structure of the semiconductor memory device according to an embodiment 1 of the present invention.
Figure 2:
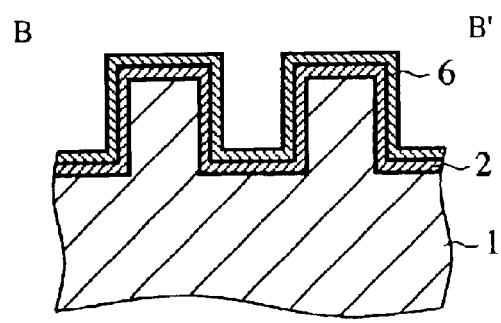
FIG. 2 is a sectional view of the semiconductor memory device according to the embodiment 1 of the present invention.
Figure 25:
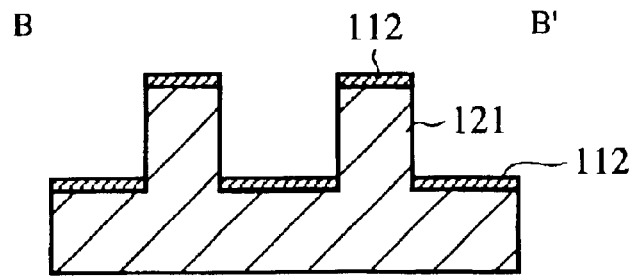
FIG. 25 is the sectional view of a specific part in a plan view showing a memory cell array, and a sectional view taken along the line B–B' in the part of a source line.
Figure 26:
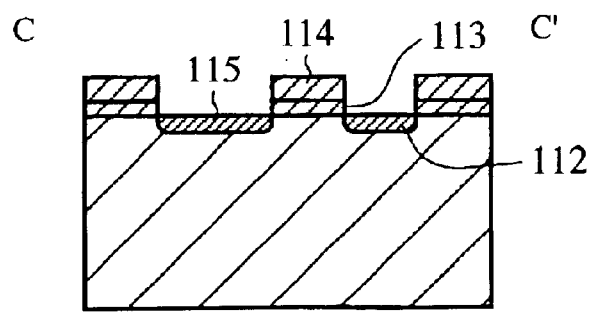
FIG. 26 is the sectional view of a specific part in a plan view showing a memory cell array, and a sectional view taken along the line C–C' in the part of a memory cell.
Figure 27:
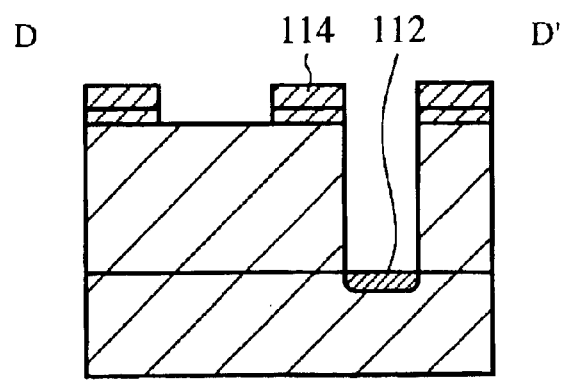
FIG. 27 is the sectional view of a specific part in a plan view showing a memory cell array, and a sectional view taken along the line D–D' in the part of STI isolation oxide film.

FIG. 1 is a perspective view showing the structure of the semiconductor memory device according to an embodiment 1 of the present invention. In FIG. 1 are shown semiconductor substrate 1, source line (diffused layer) 2 formed in a trench part serving as an isolation area having a convexoconcave surface shape, control gate (gate electrode) 3 formed of polysilicon for instance, floating gate (charge storage electrode) becoming a charge storage electrode, drain (diffused layer) 5, and silicide layer 6 formed of a cobalt silicide layer and the like for instance. FIG. 2 is a sectional view of the semiconductor memory device according to Embodiment 1 of the present invention, and a sectional view of the same part (corresponding to line B–B' in FIG. 23) as the part shown in FIG. 25 explaining the problem of the conventional technology. In FIG. 2, because the same reference numerals indicate the same or equivalent parts in FIG. 1, the explanation is omitted. The feature of the semiconductor memory device according to the embodiment 1 is that the diffused layer forming the source line is sufficiently formed also over the vertical part (corresponding to vertical part 121 in FIG. 25) of a substrate from which an STI isolation oxide film is removed.

The manufacturing method will next be described.

Figure 3:
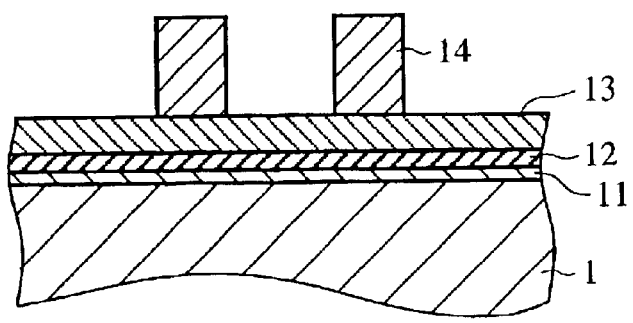
FIG. 3 is a sectional view (1) explaining a method of manufacturing the semiconductor memory device according to the embodiment 1 of the present invention.
Figure 23:
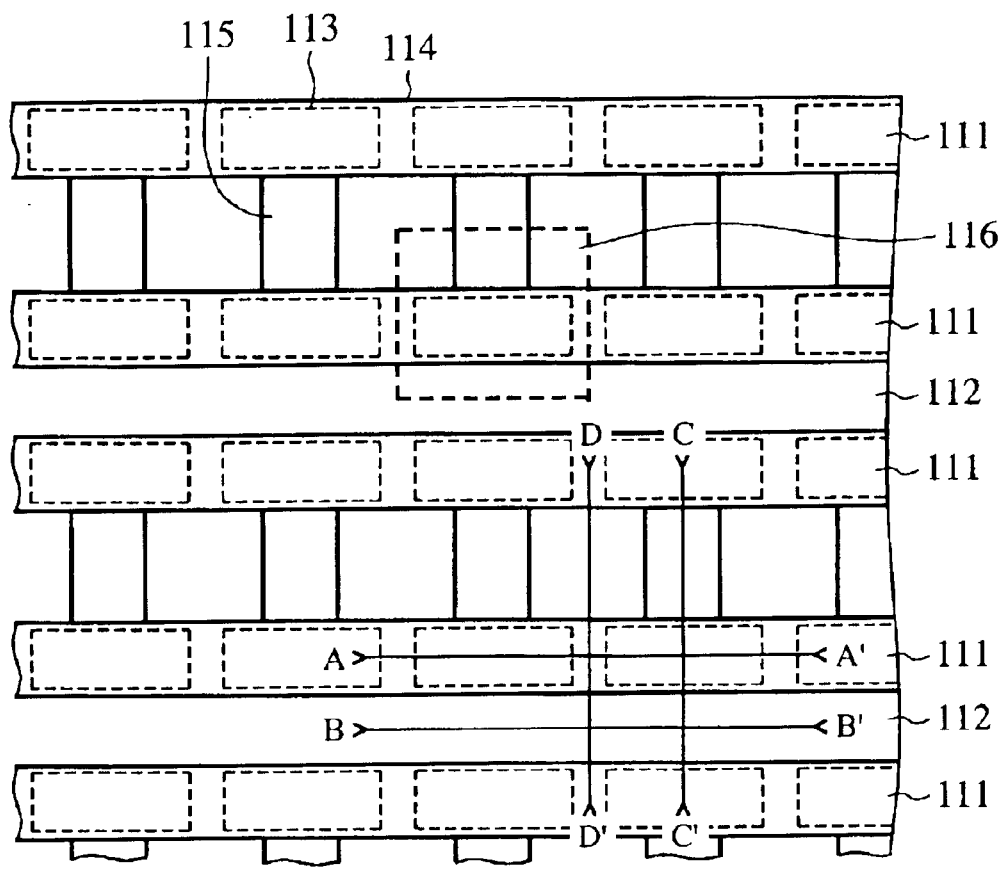
FIG. 23 is a plan view showing the memory cell array of the flash memory in the conventional semiconductor memory device.
Figure 24:
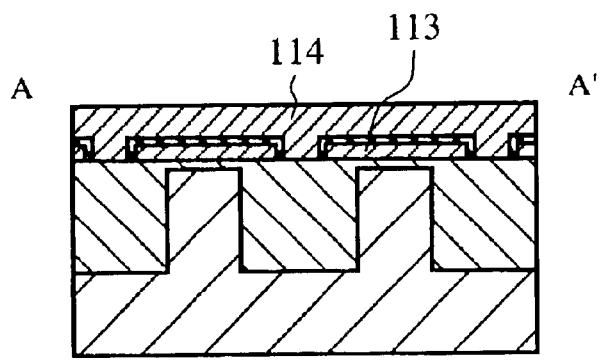
FIG. 24 is the sectional view of a specific part in a plan view showing a memory cell array, and a sectional view taken along the line A–A' in the part of a control gate.

FIGS. 3–20 are sectional views along the B–B' line in FIG. 23 explaining the method of manufacturing the semiconductor memory device according to the embodiment 1 of the present invention, and the sectional views of the same part as the part shown in FIG. 2. First of all, in FIG. 3, over the surface of semiconductor substrate 1 are deposited first oxide film 11, first polysilicon film 12, and first nitride film 13 each in a thickness of several tens of nanometers. Subsequently, in a photolithographical process, resist 14 is patterned such that the resist becomes stripe-shaped along the direction of Y and is opened in areas becoming isolation areas. The sectional view of the semiconductor memory device that underwent the processes having been described is FIG. 3.

Figure 4:
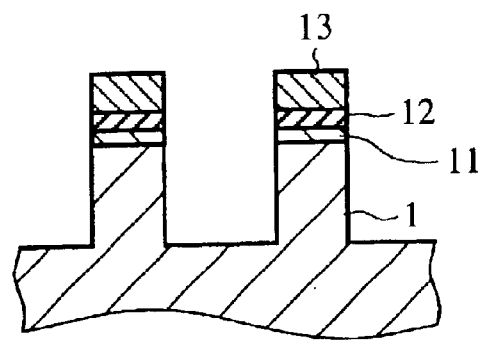
FIG. 4 is a sectional view (2) explaining the method of manufacturing the semiconductor memory device according to the embodiment 1 of the present invention.

Thereafter, in FIG. 4, first nitride film 13, first polysilicon film 12, and first oxide film 11 are etched in order by use of resist 14 serving as a mask by means of an etching technology. Further, semiconductor substrate 1 is etched to the predetermined depth. Then, resist 14 is removed. The sectional view of the semiconductor memory device that underwent the processes having been described is FIG. 4. A trench part is thereby formed in the substrate 1. Incidentally, the removal of resist 14 is done immediately after first nitride film 13 was etched, and first polysilicon film 12, first oxide film 11, and semiconductor substrate 1 may be etched in order by use of first nitride film 13 as a mask. In addition, after the etching was done, ion implantation for element isolation may be performed if necessary.

Figure 5:
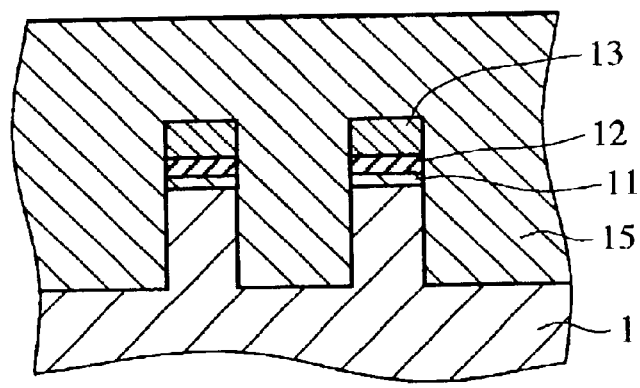
FIG. 5 is a sectional view (3) explaining the method of manufacturing the semiconductor memory device according to the embodiment 1 of the present invention.

Subsequently, in FIG. 5, second oxide film 15 (isolating oxide film) is deposited over the surface of semiconductor substrate 1 such that the oxide film is completely buried in the trench part obtained by means of the etch. The sectional view of the semiconductor memory device that underwent the processes having been described is FIG. 5.

Figure 6:
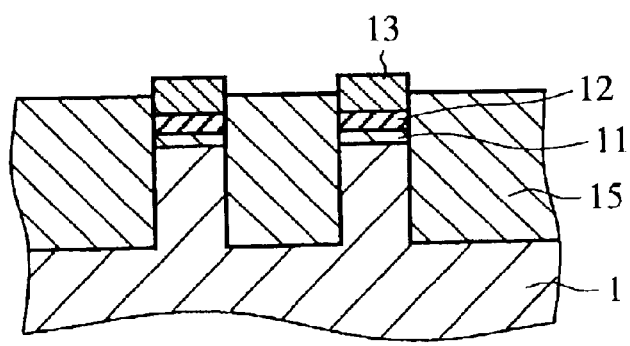
FIG. 6 is a sectional view (4) explaining the method of manufacturing the semiconductor memory device according to the embodiment 1 of the present invention.

Then, in FIG. 6, the surface of second oxide film 15 is polished by means of CMP technology until first nitride film 13 is exposed. The sectional view of the semiconductor memory device that underwent the processes having been described is FIG. 6.

Figure 7:
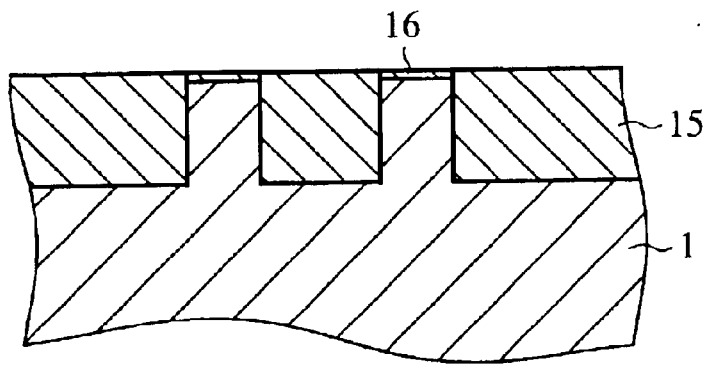
FIG. 7 is a sectional view (5) explaining the method of manufacturing the semiconductor memory device according to the embodiment 1 of the present invention.

After that, in FIG. 7, first nitride film 13 and first polysilicon film 12 are removed, and simultaneously the surface is planarized by means of hydrofluoric acid treatment. After the planarization, if necessary, an implantation-preventing film may be formed, and ion implantation for island formation and channel doped ion implantation for controlling the threshold voltage of each element may be performed. Then, in the memory cell array, third oxide film 16 having a film thickness of about 10 nm where a tunnel current flows by an electric field is formed by means of a thermal oxidation method for instance. The sectional view of the semiconductor memory device that underwent the processes having been described is FIG. 7.

Figure 8:
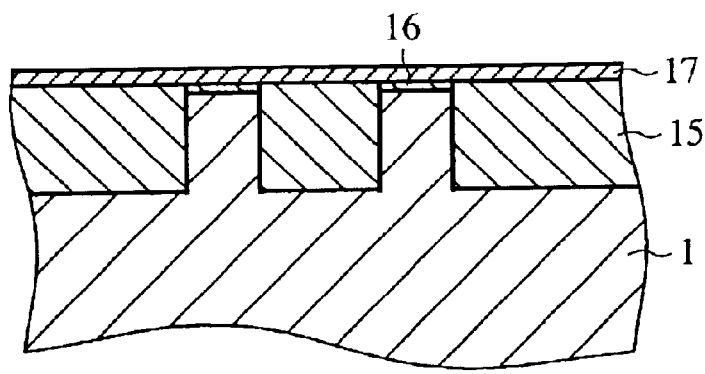
FIG. 8 is a sectional view (6) explaining the method of manufacturing the semiconductor memory device according to the embodiment 1 of the present invention.

After that, in FIG. 8, in order to form a floating gate becoming a charge storage electrode, first amorphous silicon 17 is deposited in a thickness of about 100 nm by means of a CVD method for instance. The sectional view of the semiconductor memory device that underwent the processes having been described is FIG. 8.

Figure 9:
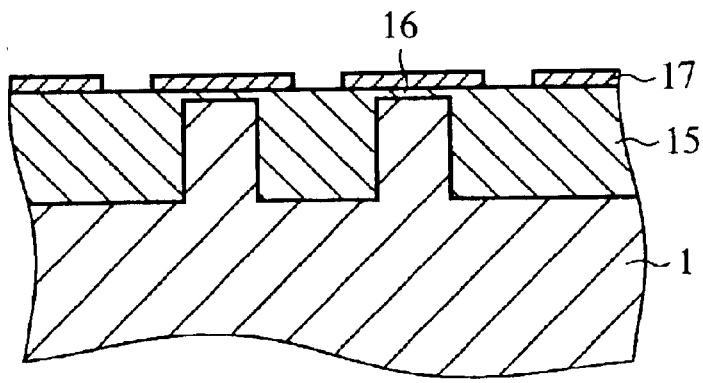
FIG. 9 is a sectional view (7) explaining the method of manufacturing the semiconductor memory device according to the embodiment 1 of the present invention.

Subsequently, in FIG. 9, in a photolithographical process, a resist is patterned in a stripe shape along the direction of Y such that the resist is opened in the approximately central part of the isolating oxide film. Next, first amorphous silicon 17 is processed by means of an etching technology by use of the resist serving as a mask. The resist is removed. The sectional view of the semiconductor memory device that underwent the processes having been described is FIG. 9.

Figure 10:
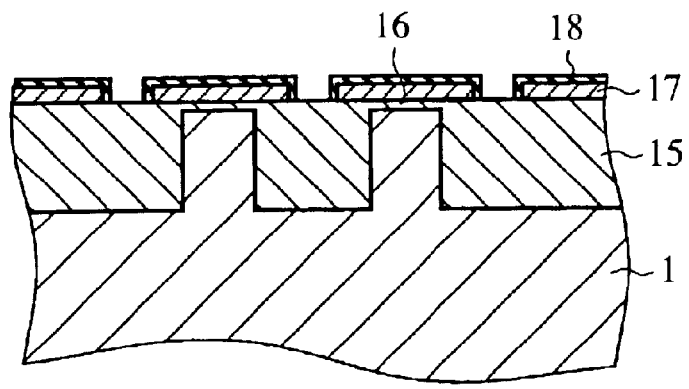
FIG. 10 is a sectional view (8) explaining the method of manufacturing the semiconductor memory device according to the embodiment 1 of the present invention.

Next, in FIG. 10, the surface of first amorphous silicon 17 is oxidized in a 100% oxygen atmosphere of about 900° C. for instance, to thereby form the fourth oxide film of several nanometers. After that, the second nitride film having a film thickness of several nanometers is formed by consecutively using a CVD method for instance, and then the fifth oxide film having a film thickness of several nanometers is formed in succession. Thereby, ONO film 18 (insulation film) 18 consisting of the fourth oxide film, the second nitride film, and the fifth oxide film is formed over the surface of first amorphous silicon 17. The sectional view of the semiconductor memory device that underwent the processes having been described is FIG. 10.

Figure 11:
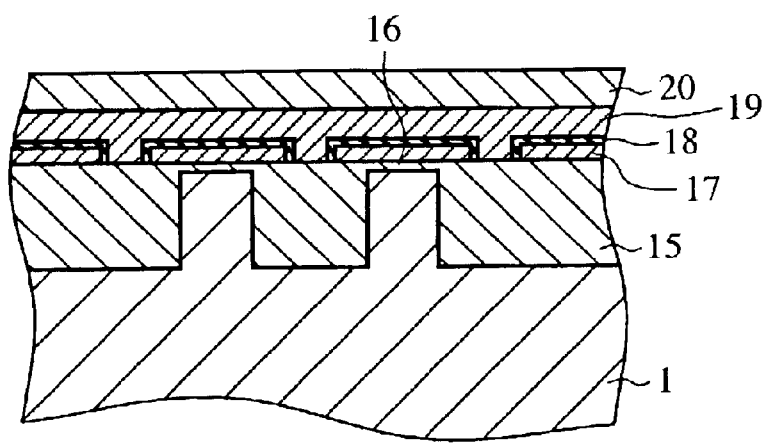
FIG. 11 is a sectional view (9) explaining the method of manufacturing the semiconductor memory device according to the embodiment 1 of the present invention.

After that, in FIG. 11, ONO film 18 is removed from an area not shown in the figure that is other than the area of the memory cell array, and simultaneously the gate oxide film of a transistor constituting a peripheral circuit is formed. Subsequently, second amorphous silicon 19 becoming the control gate within the memory cell array and becoming the gate electrode of the transistor in the peripheral circuit, is formed by means of a CVD method for instance. Then, sixth oxide film 20 having a film thickness of about 200 nm is formed over the surface of second amorphous silicon 19 by means of the CVD method for instance. The sectional view of the semiconductor memory device that underwent the processes having been described is FIG. 11.

Figure 12:
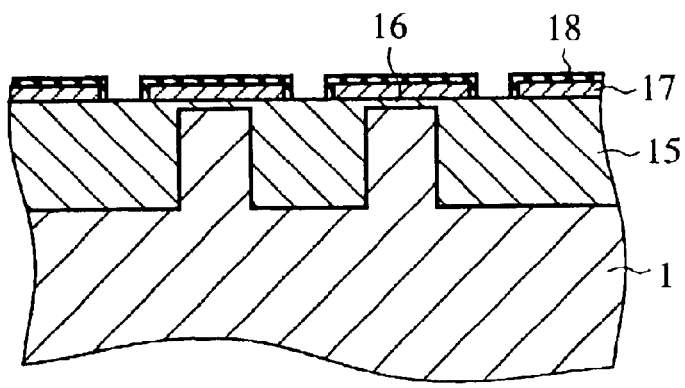
FIG. 12 is a sectional view (10) explaining the method of manufacturing the semiconductor memory device according to the embodiment 1 of the present invention.

After that, in FIG. 12, a resist is patterned in a stripe shape such that the resist opened in the direction of X within the memory cell array and such that the width of the drain area is larger than the width of the source area. Next, sixth oxide film 20 is etched, and the resist is removed. Then, second amorphous silicon 19 is etched, and the etching is stopped on ONO film 18, to thereby form the control gate. The sectional view of the semiconductor memory device that underwent the processes having been described is FIG. 12. By the way, single-layer amorphous silicon is used as the wiring material for the control gate in the embodiment 1 of the present invention. However, the wiring material is not limited only to the amorphous silicon, but a polycide structure using a high-melting-point metal may be used.

Figure 13:
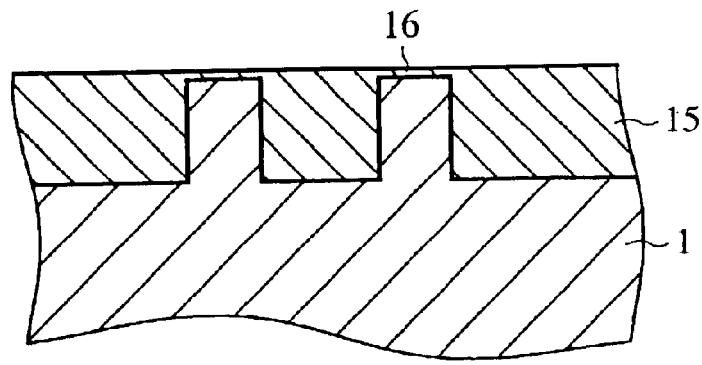
FIG. 13 is a sectional view (11) explaining the method of manufacturing the semiconductor memory device according to the embodiment 1 of the present invention.

Next, in FIG. 13, the exposed area of ONO film 18 is removed by means of etching by use of the control gate as a mask within the memory cell array. Then, the exposed area of the floating gate existing under ONO film 18 is removed by means of etching. The etching is stopped on the surfaces of second oxide film 15 and third oxide film 16. Thereby, first amorphous silicon 17 formed in a stripe shape is completely separated, and the rectangular-patterned floating gate is formed. The sectional view of the semiconductor memory device that underwent the processes having been described is FIG. 13.

Figure 14:
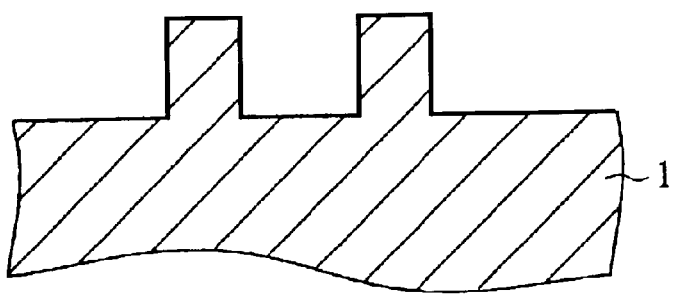
FIG. 14 is a sectional view (12) explaining the method of manufacturing the semiconductor memory device according to the embodiment 1 of the present invention.

In FIG. 14, a resist is patterned over the surface of the control gate such that the resist is opened only in the drain area and such that the edges of the resist locate in the center of the control gate. Then, ion implantation is done by use of the resist as a mask, to thereby form the drain area. By the way, in the embodiment 1 of the present invention, only the drain area was opened, and the ion implantation was performed therein. However, the present invention is not limited only to this process, but the ion implantation may be carried out when the rectangular-patterned floating gate is formed if necessary. Next, a resist is patterned over the surface of the control gate such that the resist is opened only in the source area and such that the edges of the resist locate in the center of the control gate. Subsequently, an anisotropic etching is done, to thereby remove second oxide film 15 existing in the source area. At this point, the source area enters the state in which the trench part of semiconductor substrate 1 is exposed. The sectional view of the semiconductor memory device that underwent the processes having been described is FIG. 14.

Figure 15:
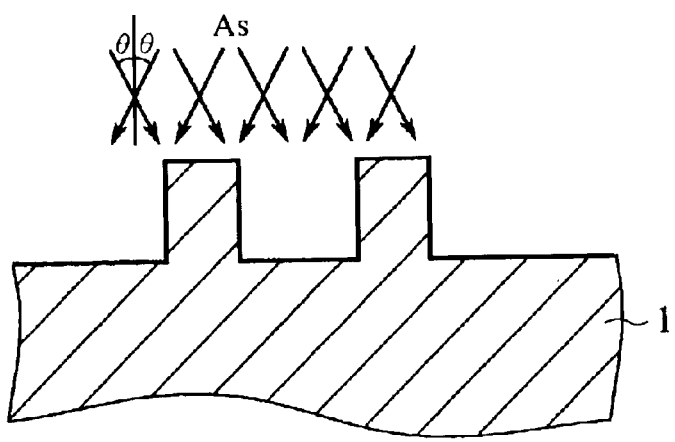
FIG. 15 is explanatory drawing explaining the ion implantation process according to the embodiment 1 of the present invention.

Then, a source line is formed by means of ion implanting in the source area. At this time, as shown in FIG. 15, at the incidence angle of the ion implantation inclined at a specific angle $\theta$ degree in the direction of X (in the direction of the gate width) to the normal direction to the semiconductor substrate 1, arsenic (As) and phosphorus (P) for instance are ion implanted therein in an amount of $1 \times 10^{15}$–$1 \times 10^{16}$ ions/cm$^2$, and the equivalent ion implantation is also done from the opposite direction. Thereby, because the ion implantation is sufficiently performed in the vertical part of the source line, the reduction of the resistance of source line 2 is achieved in the formed diffused layer. The sectional view of the semiconductor memory device that underwent the processes having been described is FIG. 16. By the way, the optimum angle $\theta$ is given by the following formula TAN($\theta$)=R/(2L), where R represents the width of the isolation oxide film, and L represents the depth of the isolation oxide film, respectively.

Figure 16:
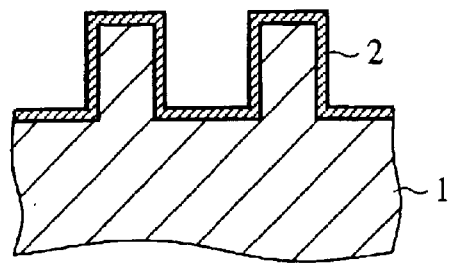
FIG. 16 is a sectional view (13) explaining the method of manufacturing the semiconductor memory device according to the embodiment 1 of the present invention.

Then, in FIG. 16, RTA treatment of about 980° C. and about 30 seconds is performed in the state where the surface oxidation film was removed. Cobalt (Co) is deposited by means of a sputtering method, and RTA treatment of about 430° C. and about 90 seconds is done. Next, the unnecessary part of cobalt is removed by means of mixed acid treatment. After that, cobalt silicide (CoSi) serving as silicide layer 6 is formed over the surface of source line 2 by means of the RTA treatment of about 850° C. and about 60 seconds. The sectional view of the semiconductor memory device that underwent the processes having been described is FIG. 16, finally obtaining the sectional structure in FIG. 2.

A contact formation process and an aluminum wiring process are done as the subsequent processes, and thereby a flash memory is completed. However, since the subsequent processes are not the principal part in present invention, the explanation is omitted herein.

As mentioned above, according to the embodiment 1, because the ion implantation is performed at the incidence angle of the ion implantation inclined at a specific angle $\theta$ degree in the direction of X to the normal direction to the semiconductor substrate 1 and the silicide layer is arranged to be formed over the surface of the source line formed by means of the ion implantation, the reduction of the resistance of the source line can be easily achieved, and at the same time the reduction of the width of the source line can be achieved by the reduction of the resistance of the source line. As a result, the area of the memory cell may be reduced.

EMBODIMENT 2

Figure 17:
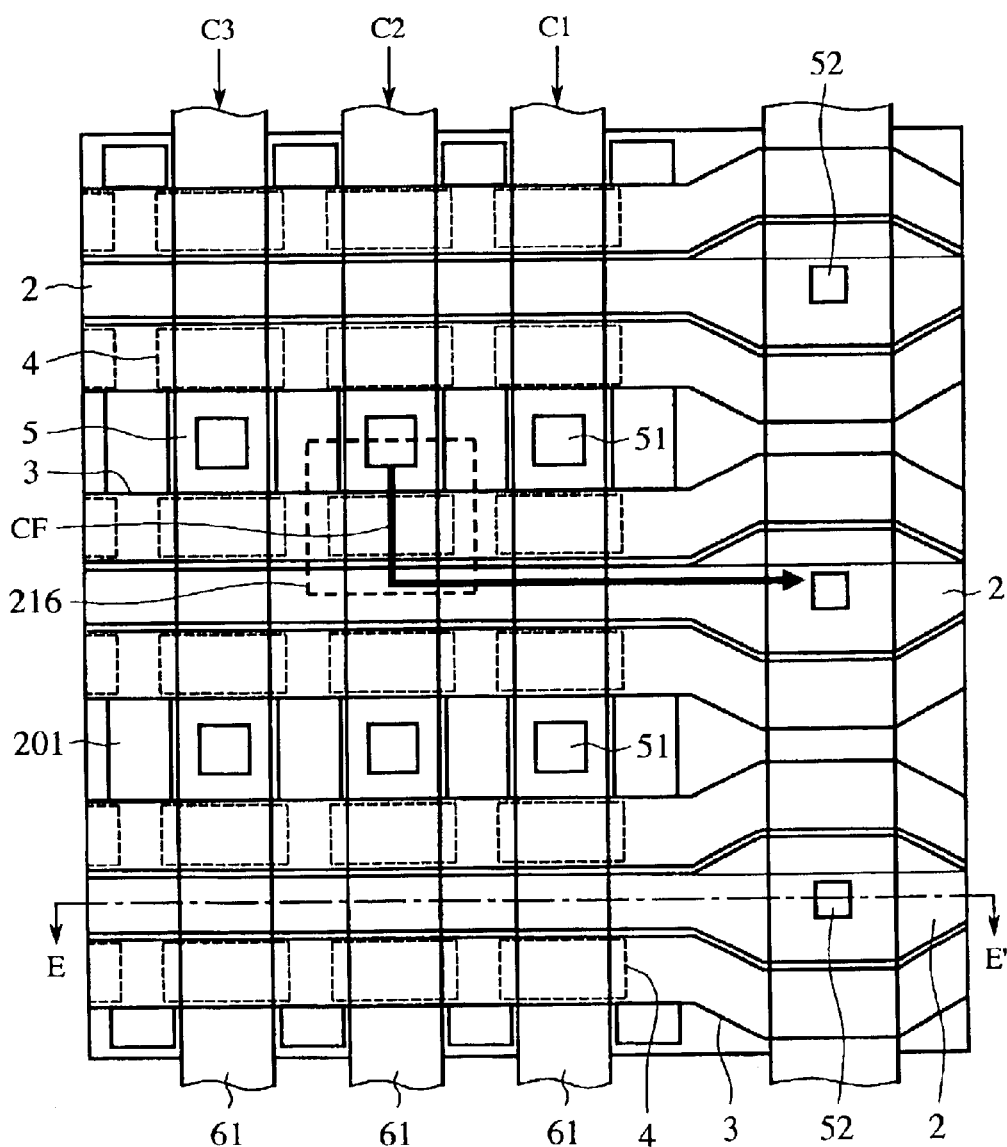
FIG. 17 is a plan view showing a memory cell array in a semiconductor memory device according to an embodiment 2 of the present invention.
Figure 18:
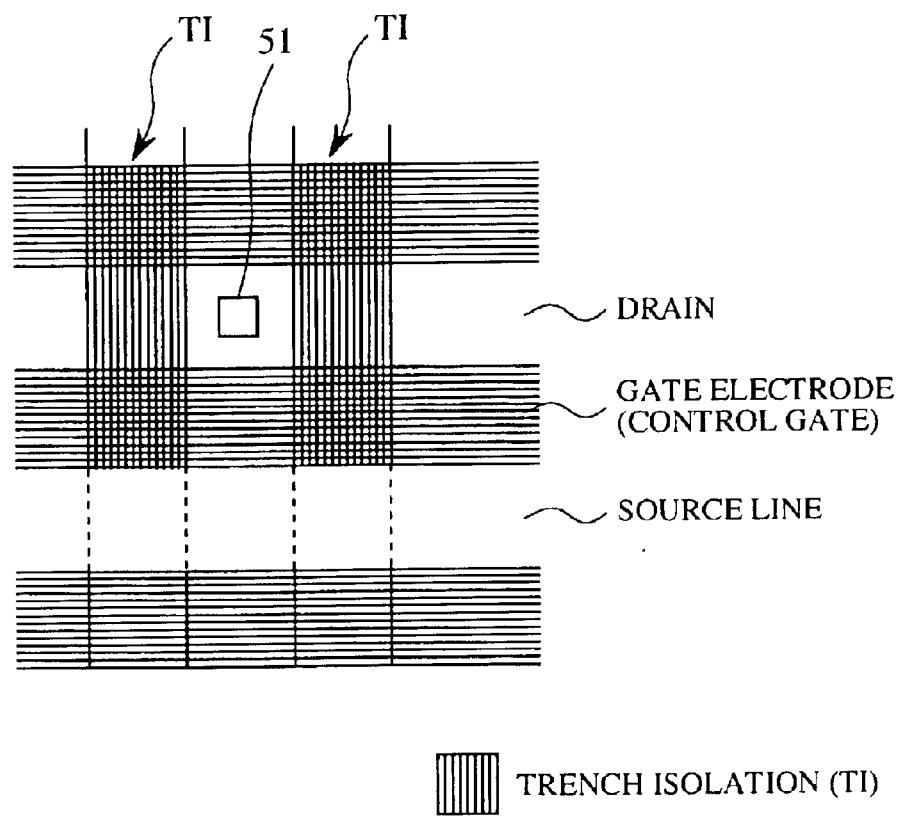
FIG. 18 is an illustrative view of formation parts of trench isolation in the plan view showing the memory cell array.
Figure 19:
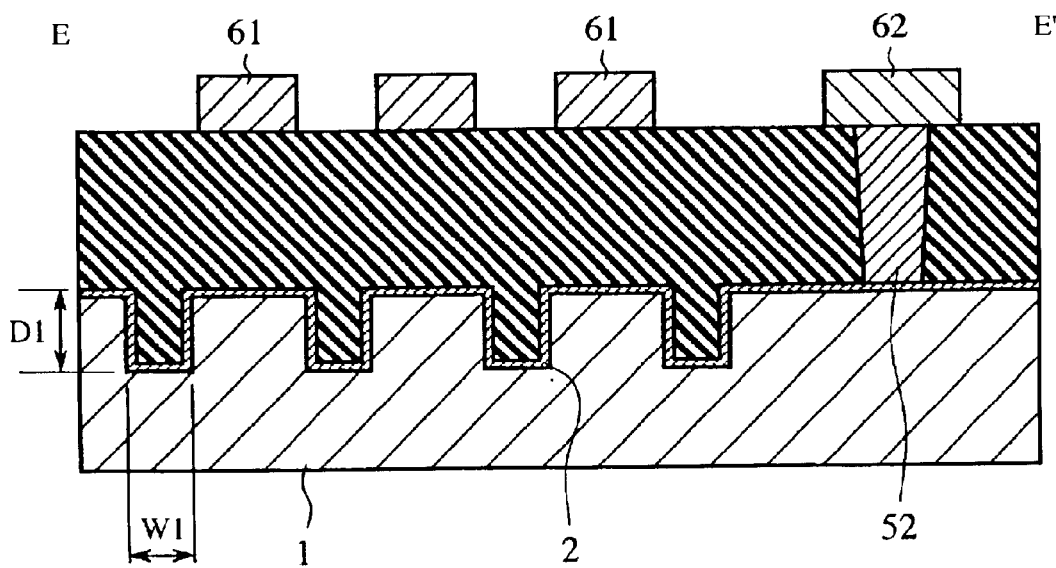
FIG. 19 is a sectional view of a specific part in the plan view showing the memory cell array, and a sectional view taken along the line E–E' in the part of a source line.

FIG. 17 is a plan view showing a memory cell array in a semiconductor memory device of a flash memory according to an embodiment 2 of the present invention, FIG. 18 is an illustrative view of formation parts of trench isolation, and FIG. 19 is a sectional view taken along the line E–E' in the part of a source line. In FIGS. 17 to 19 are shown semiconductor substrate 1, source line (first diffused layer) 2 formed in a trench part serving as an isolation area having a convexo-concave surface shape, control gate 3 formed of polysilicon for instance, floating gate (charge storage electrode) 4 serving as a charge storage electrode, drain (second diffused layer) 5, drain contact 51, source line contact 52 made of W and so on and formed on an interlayer dielectric, bit line 61 made of Al and so on, metal wiring for leading the source line or source leader 62 also made of Al and so on, isolation area 201, memory cell 216 per bit, cell columns C1–C3 respectively corresponding to the first to third cell columns from a source line, isolation depth D1, isolation width W1, and cell current flow CF.

Here, a case of 0.25 $\mu$m class in design rule will be described as one example. The width of the source line 2 formed with the silicide layer 6 on top (see FIG. 1) is approximately 0.3 $\mu$m for instance, and the cell size or area per bit is approximately 0.7×0.7 $\mu$m$^2$. In the prior art, when the sheet resistance of the source line 2 is approximately 70 $\Omega/\square$, and an interval between the source line contacts 52 is provided for each 32 bits, a bit farthest from the source line contact 52 is a sixteenth one therefrom and its resistance value is 70×(32/2)×0.7/0.3=2,613 $\Omega$.

On the other hand, in the embodiment 2, the sheet resistance of the source line 2 formed with the silicide layer 6 on top can be performed to approximately 5 Ω/□, and a resistance value up to a bit farthest from the source line contact 52 is 5×(32/2)×0.7/0.3=187 Ω, as described above.

In the sectional view of the line E–E' part, the width W1 of the isolation area is approximately 0.4 μm and the depth D1 thereof is approximately 0.3 μm. In this case, since the trench area of the source line 2 region is formed simultaneously on the formation of the isolation area 201, it is preferable that its depth and isolation width are respectively 0.1 μm or more and approximately 0.2 μm or more. Here, as shown in FIG. 18, the formation parts of the trench isolation are, for example, provided on both sides of the drain contact 51 over the neighboring gate electrodes.

The structure of the flash memory in accordance with the embodiment 2 will be discussed in detail below.

A plurality of trench parts in a stripe fashion is formed on the semiconductor substrate 1, and the control gate 3 is formed through a pattern having a longitudinal side in a direction which is orthogonal to these trench parts. Along one of the longitudinal sides of the control gate 3, the source line 2 serving as the first diffused layer is formed on the semiconductor substrate 1 between the trench parts adjacent to these surface, while a plurality of the second diffused layers (drain 5) are formed in each trench (trench isolation) on the other of the longitudinal sides. Note that the silicide layer 6 is formed on the surface of the source line 2 in a self-aligned manner with respect to the gate electrode (control gate 3) and source/drain electrodes, thereby creating a salicide.

Here, it is preferable that the source line 2 constituting the first diffused layer is formed consecutively on the sides and the bottom surface of the trench part and on the surface of the semiconductor substrate 1 between the trench parts, to thus be formed to the inside of the semiconductor substrate 1 from the salicide layer. In such a way, a junction leakage between the salicide layer and the semiconductor substrate 1 can be suppressed.

Although the formation of a deeper trench leads to an improved isolation characteristics, a simply deep trench tends to induce crystalline defects in the semiconductor substrate 1. Accordingly, it is preferable that the depth of the trench is 0.5 μm or less.

As described in the embodiment 2, when the silicide layer 6 is formed inside the trench, it is preferable that, its depth is set to approximately 0.5 μm or less so as to cover uniformly the inside of the trench by a metal film to be sputtered. The thickness of the silicide layer 6 formed on this condition is stabilized within 30–70 nm. However, when the thickness of the silicide exceeds 70 nm, it takes a long time to be required for a silicide reaction, resulting in much annealing to the semiconductor substrate 1. Accordingly, this increases the diffusion of impurities inappropriately.

That is, trench depth: approximately 0.1 to 0.5 μm and trench width: approximately 0.2 μm or more are required as a condition to obtain both stabilization of isolation characteristics, and the reduced resistance and stabilization of the silicide layer 6 on the source line 2 region.

On reading, the silicide layer 6 is provided in the region of the source line 2 to render reduced resistance, which leads to the following effects.

The cell current on reading is approximately 50 μA, and a potential elevation due to the resistance of the source line 2 in this case is 50 μA×2,613 Ω=about 0.13 V in the prior art. This means that the width of the Vth distribution of the memory cell 216 is expanded by 0.13 V because of only the effect of the resistance components of the source line 2.

As is usual for an NOR-type flash memory, in a case where bits in the cell array on erasing are batch erased.(e.g., 64 KB), the suppression of a variation of Vth distribution not only prevents the occurrence of discrepancies but also it enables the operation in lower voltages, which allows a high-speed read, and as a result, a high performance of the memory can be expected.

Normally, the variations after erasure are controlled within approximately 1.5 V in width (0.0 V to 1.5 V). The reason of 0.0 V in the lower limit is as follows: in a case where there exists a cell of 0.0 V or less (hereinafter, called overerased cell), when another cell on the same bit as the overerased cell is read out, there arises a discrepancy that a bit line potential applied is lowered due to a leakage current at the overerased cell, which makes it impossible to read out another cell.

In addition, 1.5 V in the upper limit, a case which ensures no margin, should be at least a potential or less of the word line on reading.

Since the operation voltage of a semiconductor device in 0.25 μm class is 1.8 V, the variations of the Vth distribution width after erasure have to be suppressed for requirements of further lowered voltage operations. To realize this, the effect by the source line resistance alone has to be suppressed at 0.05 V or less.

As described above, according to the embodiment 2 of the present invention, the effect by the resistance alone of the source line 2 is 50 μA×187 Ω=about 0.01 V, and the lowering effect of the upper limit in the erasure distribution is great, thereby performing a lowered voltage at the potential of the word line. Thus, as a result, it is possible to perform a high performance of the device operation at a low power consumption while a low voltage in the chip can be expected.

Figure 20:
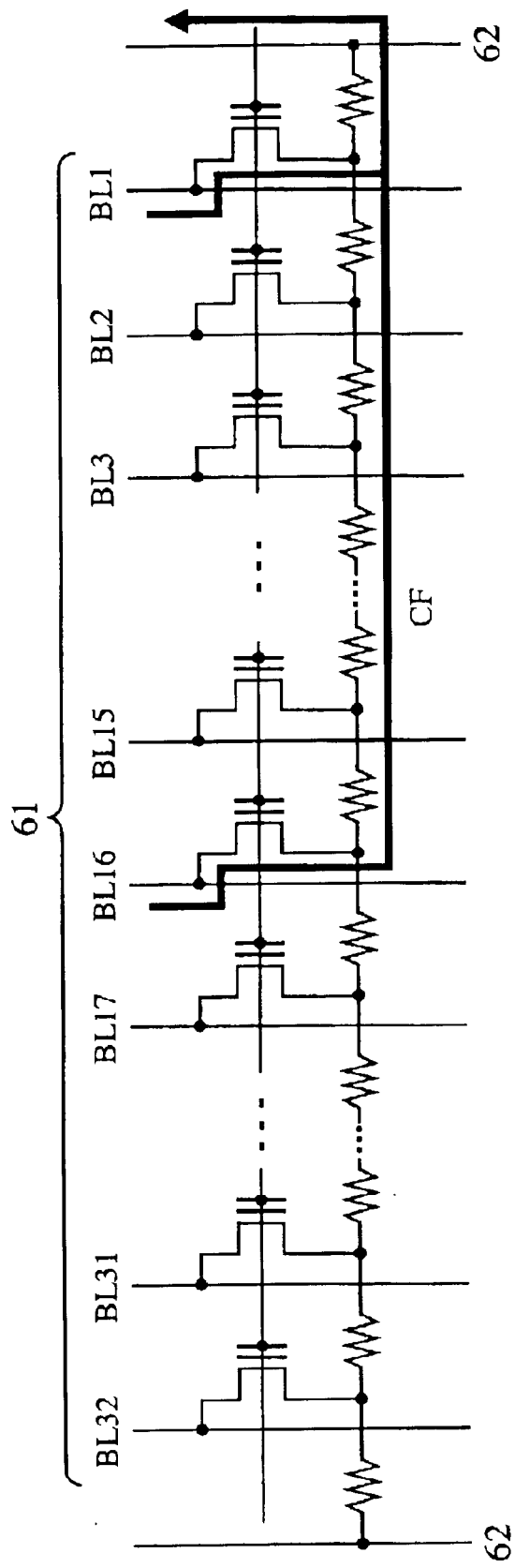
FIG. 20 is a schematic diagram illustrating an effect of source line resistance.
Figure 21:
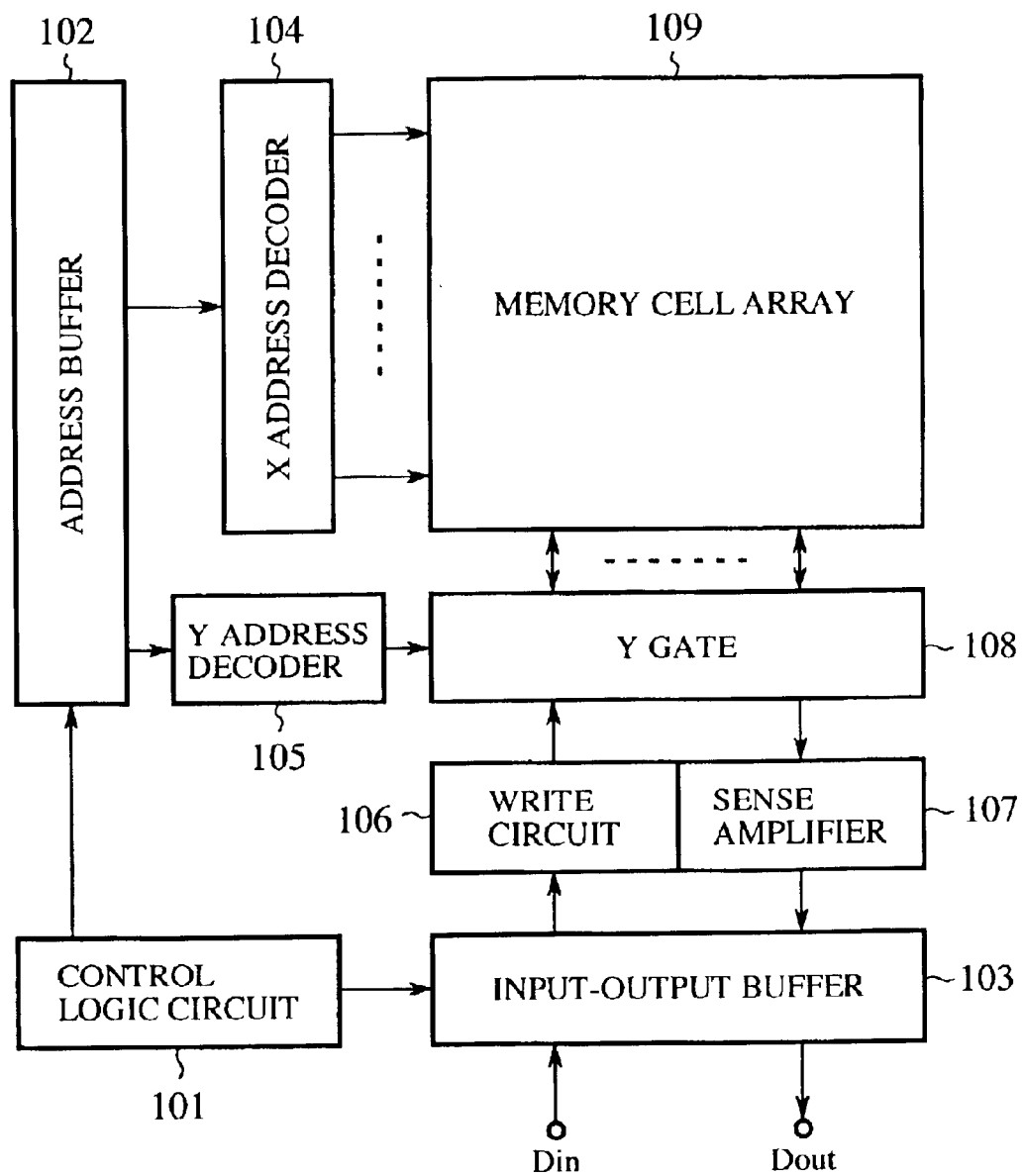
FIG. 21 is a block diagram showing the peripheral parts of the memory call array of a flash memory in the conventional semiconductor memory device.
Figure 22:
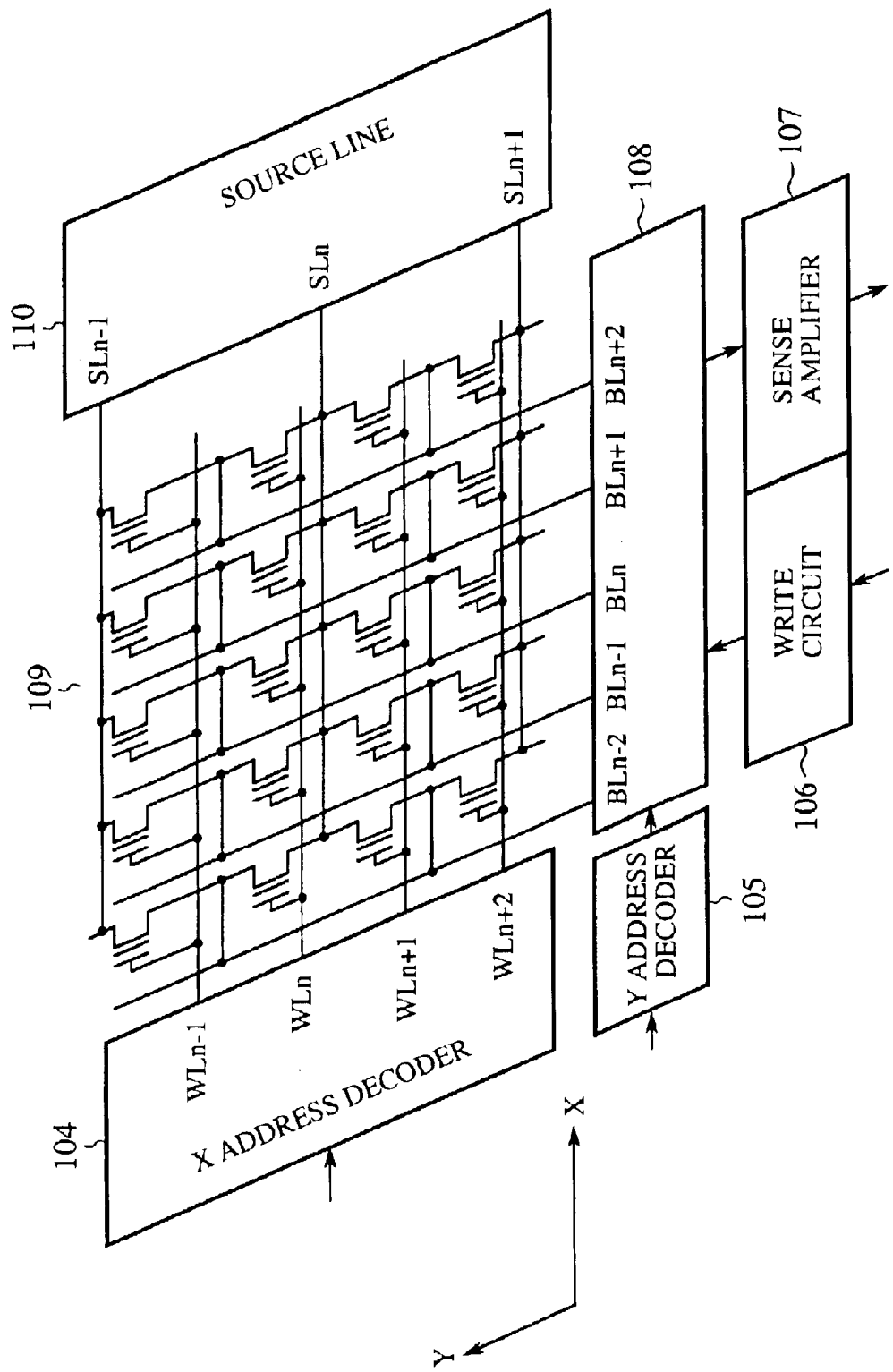
FIG. 22 is a schematic diagram showing the memory cell array of the flash memory in the conventional semiconductor memory.

In addition, FIG. 20 is a schematic diagram illustrating an effect of source line resistance, in the figure, BL1 to BL32 is symbolized independently of the bit line 61, and 62 denotes a source leader.

Although this shows one example that a contact interval of the source line is provided for each 32 bits, as compared with a cell connected to the bit line BL1 closest to the source line, a cell connected to the bit line BL16 farthest from the source line is subjected to sixteen times the effect of the source line resistance, thereby reducing the cell current. The sense amplifier determines the threshold voltage Vth based on the cell current amount. Thereby, a difference between the cell currents leads to determine as a different Vth for the sense amplifier.

Thus, even when any fabrication variations on the cell characteristics are suppressed, an improved uniformity of the cell characteristics in appearance cannot be expected as far as the resistance of the source line is reduced. However, according to the embodiment 2 of the present invention, the uniformity of the cell characteristics can be improved.

What is claimed is:

1. A semiconductor memory device, comprising:
    a plurality of trench parts in a stripe shape formed on a semiconductor substrate;
    a gate electrode formed to be orthogonal to said plurality of trench parts and having longitudinal sides along the orthogonal direction;
    a first diffused layer formed on the surface of said trench parts and on said semiconductor substrate between said trench parts adjacent to each other along one of said longitudinal sides;

a salicide layer formed on the surface of said first diffused layer; and a plurality of second diffused layers formed between the trenches on the other of the longitudinal sides.

2. The semiconductor memory device according to claim 1, wherein the first diffused layer is formed consecutively on the sides and bottom surfaces of the trench parts, and on the surface of the semiconductor substrate between the trench parts, and is formed to the inside of the semiconductor substrate from the salicide layer.

3. The semiconductor memory device according to claim 1, wherein the diffused layer is formed by means of ion implantation at the incidence angle of the ion implantation inclined at a specific angle to the direction of the normal to the semiconductor substrate in the direction of the gate width of the gate electrode.

4. The semiconductor memory device according to claim 1, wherein the depth of the trench parts is 0.1 to 0.5 μm, and the width of the trench parts is at least 0.2 μm or more.

5. The semiconductor memory device according to claim 1, wherein the thickness of the salicide layer is 30 to 70 nm.

* * * * *